(12) United States Patent  
Hasegawa

(10) Patent No.: US 6,686,741 B2
(45) Date of Patent: Feb. 3, 2004

(54) MULTIPLE-TUNED CIRCUIT AND PROBE FOR NMR SPECTROMETER

(75) Inventor: Kenichi Hasegawa, Tokyo (JP)

(73) Assignee: Jeol Ltd., Tokyo (JP)

( * ) Notice: Subject to any disclaimer, the term of this patent is extended or adjusted under 35 U.S.C. 154(b) by 0 days.

(21) Appl. No.: 10/117,985

(22) Filed: Apr. 8, 2002

(65) Prior Publication Data

US 2002/0171426 A1 Nov. 21, 2002

(51) Int. Cl.[7] .................................................. G01V 3/00
(52) U.S. Cl. ........................................ 324/322; 324/318
(58) Field of Search ................................ 324/322, 318, 324/307, 309

(56) References Cited

U.S. PATENT DOCUMENTS

| 4,633,181 | A | * | 12/1986 | Murphy-Boesch et al. . | 324/322 |
| 4,737,711 | A | * | 4/1988 | O'Hare ........................ | 324/300 |
| 5,260,658 | A | * | 11/1993 | Greim et al. ................ | 324/322 |
| 5,317,266 | A | * | 5/1994 | Meissner .................... | 324/318 |
| 5,861,748 | A | * | 1/1999 | Schaefer et al. ............ | 324/318 |
| 6,307,371 | B1 | * | 10/2001 | Zeiger ......................... | 324/318 |
| 6,329,820 | B1 | * | 12/2001 | Hasegawa et al. .......... | 324/315 |

FOREIGN PATENT DOCUMENTS

JP          10-2947      * 10/1998

OTHER PUBLICATIONS

"A Multinuclear Double–Tuned Probe for Applications with Solids or Liquids Utilizing Lumped Tuning Elements", F. David Doty et al., *Journal of Magnetic Resonance* 43, pp. 399–416 (1981).

* cited by examiner

Primary Examiner—Diego Gutierrez
Assistant Examiner—Dixomara Vargas
(74) Attorney, Agent, or Firm—Webb Ziesenheim Logsdon Orkin & Hanson, P.C.

(57) ABSTRACT

A multiple-tuned circuit and a probe for use in a nuclear magnetic resonance (NMR) spectrometer. The multiple-tuned circuit having improved power capacity, thus permitting injection of high electric power. The multiple-tuned circuit and probe improve the resonance frequencies at higher and lower frequencies. Instead of the prior art coaxial resonator that is an unbalanced circuit, a balanced resonator circuit is used. A tuning circuit and a matching circuit for a higher frequency is connected in an intermediate position in the balanced resonator circuit. A tuning capacitive element for a lower frequency is inserted between the balanced resonator circuit and a sample coil or in an intermediate position in the balanced resonator circuit.

17 Claims, 6 Drawing Sheets

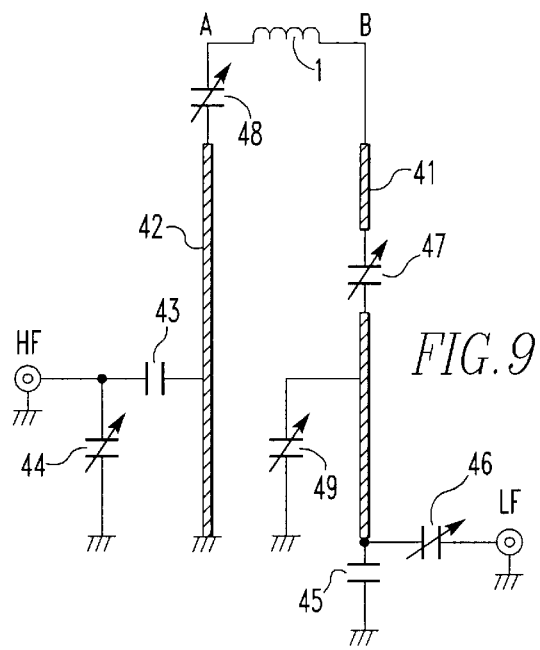
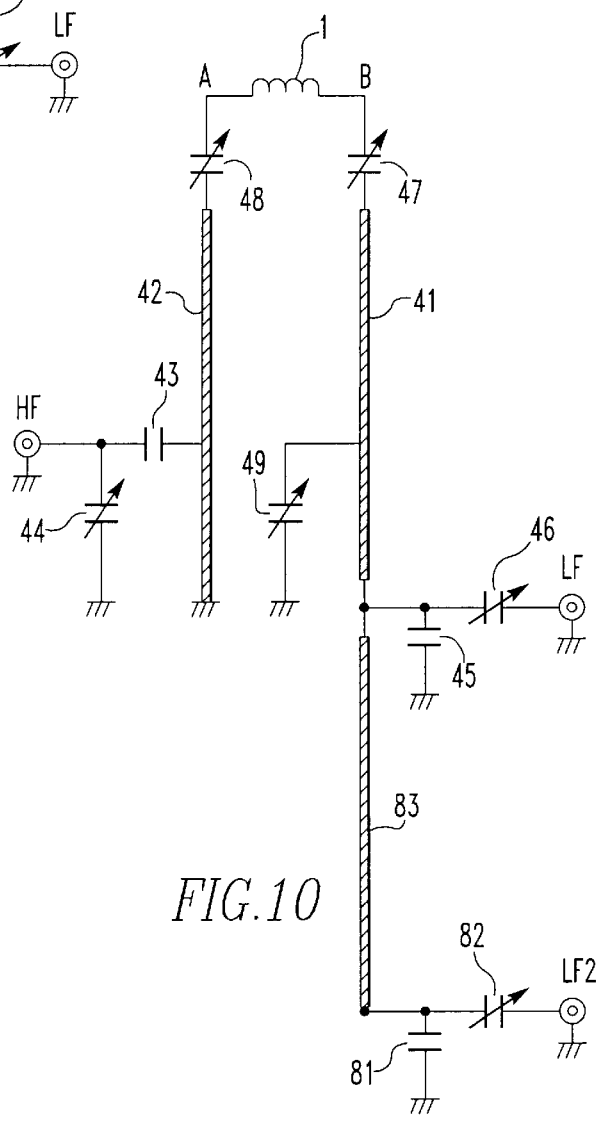
FIG. 9
FIG. 10

MULTIPLE-TUNED CIRCUIT AND PROBE FOR NMR SPECTROMETER

BACKGROUND OF THE INVENTION

1. Field of the Invention

The present invention relates to a multiple-tuned circuit and a probe for use in a nuclear magnetic resonance (NMR) spectrometer and, more particularly, to a multiple-tuned circuit and a probe used in an NMR spectrometer and which show enhanced resistance to RF voltages by performing a balanced operation.

2. Description of Related Art

In the description given below, a higher NMR frequency and a lower NMR frequency are often designated as HF (higher frequency) and LF (lower frequency), respectively. FIGS. 1 and 2 show the conventional double-tuned circuit. In FIG. 2, the amplitude of an RF voltage developed across the coaxial resonators 2, 3 when a higher frequency for an HF nucleus is at resonance are shown simultaneously. The circuit shown in FIGS. 1 and 2 can be tuned to the resonance frequency of an HF nucleus (e.g., $^1$H nucleus). In addition, the circuit can be simultaneously tuned to the resonance frequency of an LF nucleus (e.g., $^{13}$C nucleus). The circuit has a sample coil 1 consisting of a solenoid coil, saddle coil, or the like. Coaxial resonators 2 and 3 have a length equal to a quarter wavelength of the resonance frequency of the HF nucleus. The outer conductors of the resonators 2 and 3 are grounded during use. The coaxial resonator 2 that is electrically open is connected with one end of the sample coil 1, while the coaxial resonator 3 that is short-circuited is connected with the other end. A tuning variable capacitor 4 and a matching variable capacitor 5 are connected with the HF input/output side. A tuning variable capacitor 6 and a matching variable capacitor 7 are connected with the LF input/output side. A capacitor 8 acts to compensate for insufficiency of the capacitance of the LF tuning variable capacitor 4.

The operation is described next. As shown in FIG. 2, at the resonance frequency of the HF nucleus, the RF voltage developed across the open coaxial resonator 2 assumes a minimum amplitude of 0 at the upper end (as shown in the drawings) and a maximum amplitude of $V_m$ at the lower end. The RF voltage at the shorted coaxial resonator 3 assumes a maximum amplitude of $V_m$ at the upper end and a minimum amplitude of 0 at the lower end. The frequency can be adjusted with the tuning variable capacitor 4. Since the voltage amplitude is minimal at the upper end of the open coaxial resonator 2 at this time, HF power flowing into the LF side is small. At the resonance frequency of the LF nucleus, the open coaxial resonator 2 is not associated but the shorted coaxial resonator 3 acts as a grounded inductance L. Therefore, the frequency can be adjusted by the tuning variable capacitor 6 connected in parallel with the sample coil 1 and the opened coaxial resonator 2. In this way, this type of double-tuned circuit can adjust the HF and LF independently.

FIG. 3 shows another conventional double-tuned circuit. Note that like components are indicated by like reference numerals in various figures including FIGS. 1 and 2. A sample coil 1 consists of a solenoid coil, saddle coil, or the like. Two conductors 31 and 32 have a length equal to a quarter wavelength of the resonance frequency of an HF nucleus and form a parallel transmission line. The conductors 31 and 32 are grounded via tuning capacitors 10 and 11 for an LF nucleus during use. The sample coil 1 is connected between the two conductors 31 and 32. The conductors 31 and 32 are surrounded by a conductive outer tube 14 that is grounded. A tuning capacitor 9 for an HF nucleus is connected with the conductor 31. A tuning variable capacitor 4 and a matching variable capacitor 5 for the HF nucleus are connected with the conductor 32. At this time, the tuning variable capacitor 4 for the HF nucleus and the tuning capacitor 9 for the HF nucleus are so set up that their capacitances are nearly equal. A tuning variable capacitor 6 and a matching variable capacitor 7 for the LF nucleus are connected with the conductor 31.

At the resonance frequency of the HF nucleus, the tuning capacitors 10 and 11 for the LF nucleus have large capacitances and so their impedances are small. The conductors 31 and 32 are equivalent to the case where their ends are short-circuited. The conductors 31 and 32 are grounded together with the outer tube 14. As a result, the conductors 31, 32 and the outer tube 14 together operate as a quarter wavelength balanced resonant circuit at the resonance frequency of the HF nucleus. In particular, with respect to the conductors 31 and 32, the capacitance of the tuning variable capacitor 4 for the HF nucleus and the capacitance of the tuning capacitor 9 for the HF nucleus are set to nearly equal values. Therefore, RF voltages $V_m/2$ and $-V_m/2$ which are substantially equal in amplitude but opposite in polarity are produced at the opposite ends of the sample coil 1. Electrical currents of opposite polarities flow through the conductors 31 and 32 by the action of a kind of transformer. These RF voltages are halves of the voltage $V_m$ shown in FIGS. 1 and 2. These voltages are applied to the tuning variable capacitors 4 and 5 for the HF nucleus.

Meanwhile, at the resonance frequency of the LF nucleus, the tuning capacitors 10 and 11 for the LF nucleus and the tuning variable capacitor 6 for the LF nucleus together form an LC resonant circuit. The capacitor 10 is connected in series with the sample coil 1 and the conductor 31. Similarly, the capacitor 11 is connected in series with the sample coil 1 and the conductor 32. The tuning variable capacitor 6 is connected in parallel with the capacitor 10. The frequency can be adjusted with the tuning variable capacitor for the LF nucleus. At this time, RF voltages which are almost equal in amplitude but opposite in polarity are produced at the opposite ends of the sample coil 1 by appropriately setting the capacitance of the tuning capacitors 10 and 11 for the LF nucleus. Therefore, the RF voltages applied to the tuning variable capacitors 6 and 7 for the LF nucleus can be held down to halves of the values in the case of FIGS. 1 and 2.

In the example of FIGS. 1 and 2, one end of the sample coil 1 is at ground potential at HF resonance and is near ground potential at LF resonance. Therefore, at HF resonance, a potential difference corresponding to the maximum amplitude at HF is directly applied across the variable capacitors 4 and 5. At LF resonance, a potential difference corresponding to the maximum amplitude at LF is directly applied across the variable capacitors 6, 7 and capacitor 8. Therefore, when high electric power is applied to the sample coil 1, electric discharging takes place, thus damaging these electrical parts.

The extraction line from the sample coil 1 is lengthened. This creates loss in the current path at LF resonance. Consequently, it is impossible to increase the resonance frequency of the LF nucleus. In this case, it may be conceivable to increase the resonance frequency by adding a dummy coil in parallel with the sample coil 1 to lower the inductance of the whole coil assembly. If this countermeasure is taken, however, an electrical current also flows through the dummy coil, increasing power loss. In this way, this countermeasure is inappropriate.

The configuration of FIG. 3 has the advantage that the voltage applied to the tuning variable capacitor 4 and matching variable capacitor 5 at HF resonance and the voltage applied to the tuning variable capacitor 6 and matching variable capacitor 7 at LF resonance are halves of the voltages applied in the case of FIG. 1. The conductors 31 and 32 are connected in series with the sample coil 1. Therefore, these conductors act as extraction lines at LF resonance. This increases the inductance of the whole coil assembly. As a result, the LF resonance frequency drops.

In the configuration of FIG. 3, it is necessary to connect capacitors 10 and 11 having considerably large capacitance in order to operate the conductors 31 and 32 as a quarter wavelength balanced resonator circuit for HF. If the capacitance of a capacitor is increased, the LF resonance frequency will drop concomitantly.

SUMMARY OF THE INVENTION

In view of the foregoing, it is an object of the present invention to provide a multiple-tuned circuit and a probe for use in a nuclear magnetic resonance spectrometer, which permit injection of high frequency electric power by improving the power capacity of the multiple-tuned circuit, and enhance resonance frequencies at both higher frequency (HF) and lower frequency (LF) resonances.

A multiple-tuned circuit for use in a nuclear magnetic resonance spectrometer in accordance with the present invention solves the problem described above and comprises: a sample coil having ends A and B; a first conductor having one end connected with the end A of the sample coil and another end connected to ground via a capacitive element or directly; a second conductor having one end connected with the end B of the sample coil and another end connected to ground via a capacitive element or directly; a tuning capacitive element for a second frequency, the tuning capacitive element being inserted in at least one of the junction (also referred to herein as the first junction) of the end A of the sample coil and the first conductor, a given position closer to the first conductor than the first junction, the junction (also referred to herein as the second junction) of the end B of the sample coil and the second conductor, and a given position closer to the second conductor than the second junction; a matching circuit and a tuning circuit for a first frequency; and a matching circuit for the second frequency.

In one feature of the multiple-tuned circuit described above, the first and second conductors and the capacitive elements together form a quarter wavelength resonator for the first frequency. Some of the capacitive elements are connected to the ends of the conductors. The other capacitive elements are connected with the given positions closer to the conductors than the ends.

In another feature of the multiple-tuned circuit described above, the matching circuit for the first frequency is located in a given position in the first conductor or in a given position on the second conductor.

In a further feature of the multiple-tuned circuit described above, the tuning circuit for the first frequency is located in at least one of a given position in the first conductor and a given position in the second conductor.

In still another feature of the multiple-tuned circuit described above, the matching circuit for the second frequency is located in a given position in the first conductor or in a given position in the second conductor.

In yet another feature of the multiple-tuned circuit described above, electric circuit components, such as capacitive elements and inductive elements, are replaceably added in parallel with the tuning capacitive element for the second frequency, the tuning capacitive element being inserted in at least one of the first junction of the end A of the sample coil and the first conductor, a given position closer to the first conductor than the first junction, the second junction of the end B of the sample coil and the second conductor, and a given position closer to the second conductor than the second junction.

In an additional feature of the multiple-tuned circuit described above, the first frequency is higher than the second frequency.

In yet another additional feature of the multiple-tuned circuit described above, there is further provided a third conductor. One end of this third conductor is connected with at least one of the ends of the first and second conductors. The other end of the third conductor is connected with a matching circuit for the third frequency and grounded via a capacitive element.

In a further feature of the multiple-tuned circuit described above, the first frequency is higher than the second and third frequencies.

The present invention also provides a probe for use in an NMR spectrometer, the probe including a multiple-tuned circuit comprising: a sample coil having ends A and B; a first conductor having one end connected with the end A of the sample coil and another end connected to ground via a capacitive element or directly; a second conductor having one end connected with the end B of the sample coil and another end connected to ground via a capacitive element or directly; a tuning capacitive element for a second frequency, the tuning capacitive element being inserted in at least one of the first junction of the end A of the sample coil and the first conductor, a given position closer to the first conductor than the first junction, the second junction of the end B of the sample coil and the second conductor, and a given position closer to the second conductor than the second junction; a matching circuit and a tuning circuit for a first frequency; and a matching circuit for the second frequency. This probe is characterized in that there is further provided a tubular electrode surrounding at least the outer surfaces of electrical circuit portions of the multiple-tuned circuit, and that this tubular electrode is used as a grounding electrode for the multiple-tuned circuit.

In one feature of this NMR probe, the first and second conductors and the capacitive elements together form a quarter wavelength resonator for the first frequency. Some of the capacitive elements are connected to the ends of the conductors. The other capacitive elements are connected with the given positions closer to the conductors than the ends.

In another feature of the NMR probe described above, the matching circuit for the first frequency is located in a given position in the first conductor or in a given position in the second conductor.

In a further feature of the NMR probe described above, the tuning circuit for the first frequency is located in at least one of a given position in the first conductor and a given position in the second conductor.

In still another feature of the NMR probe described above, the matching circuit for the second frequency is located in a given position in the first conductor or in a given position in the second conductor.

In yet another feature of the NMR probe described above, electric circuit components, such as capacitive elements and inductive elements, are replaceably added in parallel with the tuning capacitive element for the second frequency, the tuning capacitive element being inserted in at least one of the first junction of the end A of the sample coil and the first conductor, a given position closer to the first conductor than the first junction, the second junction of the end B of the sample coil and the second conductor, and a given position closer to the second conductor than the second junction.

In an additional feature of the NMR probe described above, the first frequency is higher than the second frequency.

In yet another additional feature of the NMR probe described above, there is further provided a third conductor whose one end is connected with at least one of the ends of the first and second conductors, the other end being connected with a matching circuit for the third frequency and grounded via a capacitive element.

In a further feature of the NMR probe described above, the first frequency is higher than the second and third frequencies.

In still another additional feature of the NMR probe described above, the aforementioned tubular electrode is provided with an opening in a given position to place the inside of the probe in communication with the outside.

Other objects and features of the invention will appear in the course of the description thereof, which follows.

BRIEF DESCRIPTION OF THE DRAWINGS

FIG. 9 is a circuit diagram of an additional multiple-tuned circuit according to the present invention, the circuit being for use in an NMR spectrometer;

FIG. 10 is a circuit diagram of a still further multiple-tuned circuit according to the present invention, the circuit being for use in an NMR spectrometer.

DESCRIPTION OF THE PREFERRED EMBODIMENTS

The preferred embodiments of the present invention are hereinafter described with reference to the accompanying drawings.

Figure 4:
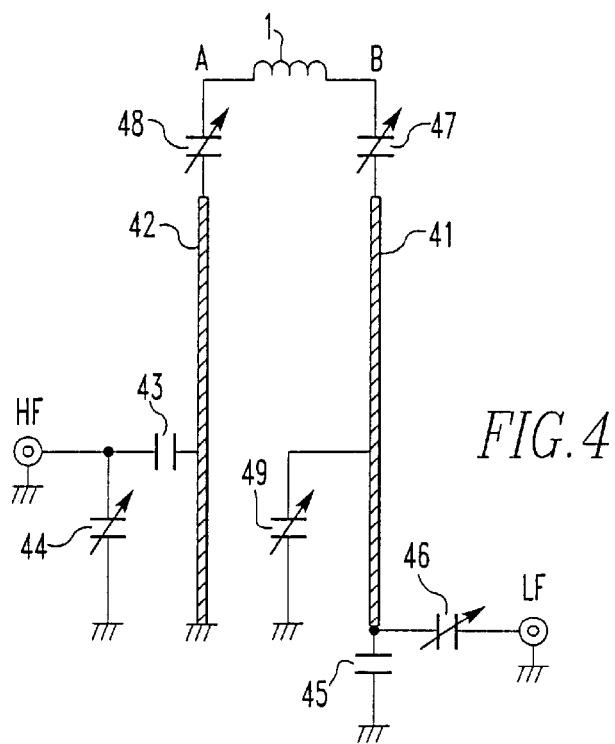
FIG. 4 is a circuit diagram of a multiple-tuned circuit according to the present invention, the circuit being for use in an NMR spectrometer.

Referring to FIG. 4, there is shown a multiple-tuned circuit according to the present invention which is useful in an NMR (nuclear magnetic resonance) spectrometer. This circuit has conductors 41 and 42 which together form a parallel transmission line. At higher frequency (HF) resonance, the ratio of input electric power supplied to a sample coil (described later) is adjusted by adjusting the characteristic impedance of the parallel line resonator formed by the conductors 41 and 42. Since the conductors 41 and 42 are only required to operate as transmission lines, their shape is not limited to a rod-like form. Helical coils and coaxial lines whose outer conductors are grounded may also be used.

Figure 5:
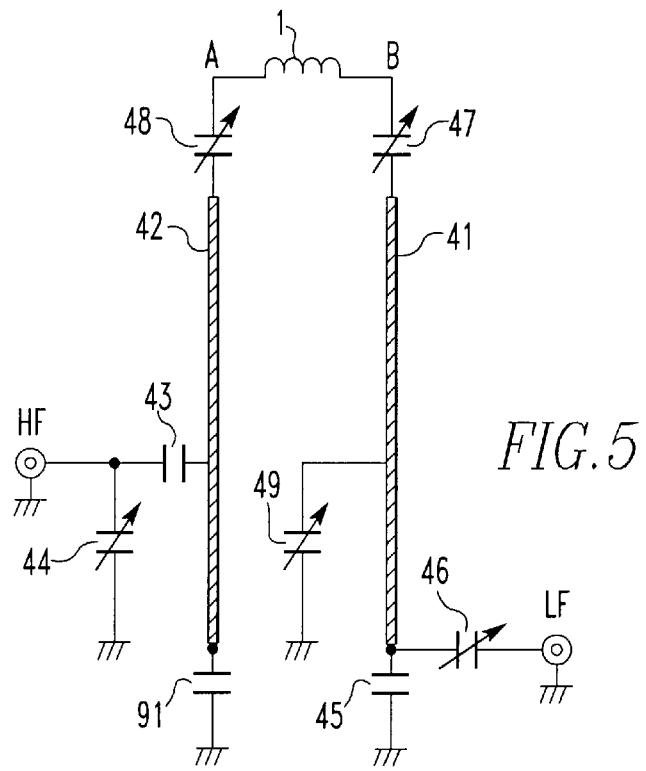
FIG. 5 is a circuit diagram of another multiple-tuned circuit according to the present invention, the circuit being for use in an NMR spectrometer.

The aforementioned sample coil, indicated by reference numeral 1, consists of a solenoid coil, saddle coil, or the like and is connected with the upper ends of the conductors 41 and 42 via variable capacitors 47 and 48 for lower frequency (LF) tuning. The lower end of the conductor 42 is directly grounded. The lower end of the conductor 41 is indirectly grounded via a capacitor 45. Conversely, the lower end of the conductor 41 may be directly grounded, and the lower end of the conductor 42 may be indirectly grounded via the capacitor 45. Alternatively, as shown in FIG. 5, the lower ends of both conductors 41 and 42 may be indirectly grounded via capacitors 45 and 91. These circuit configurations are equivalent circuits.

Figure 6:
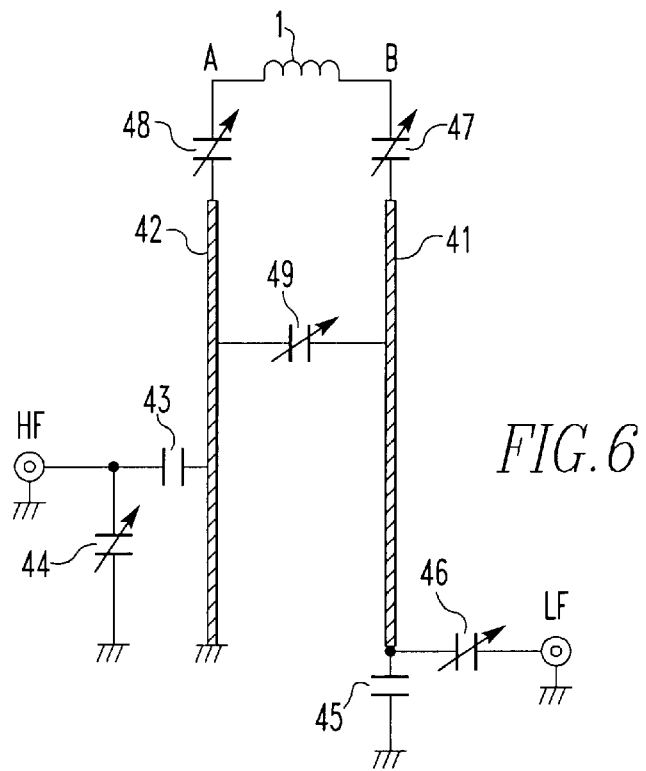
FIG. 6 is a circuit diagram of a further multiple-tuned circuit according to the present invention, the circuit being for use in an NMR spectrometer.

An HF matching circuit consisting of a capacitor 43 and a variable capacitor 44 for HF matching is connected in an arbitrary intermediate position in the conductor 42. A variable capacitor 49 for HF tuning is connected in an arbitrary intermediate position in the conductor 41. The variable capacitor 49 may be connected in an arbitrary intermediate position in the conductor 42. Alternatively, as shown in FIG. 6, the capacitor 49 may be connected between an arbitrary intermediate position in the conductor 41 and an arbitrary intermediate position in the conductor 42. The lengths of the conductors 41, 42, the values of the variable capacitors 47, 48, and the value of the capacitor 45 are appropriately set such that the whole circuitry operates as a quarter wavelength resonator at HF resonance. A variable capacitor 46 for LF matching is connected to the junction of the conductor 41 and the capacitor 45.

Figure 7:
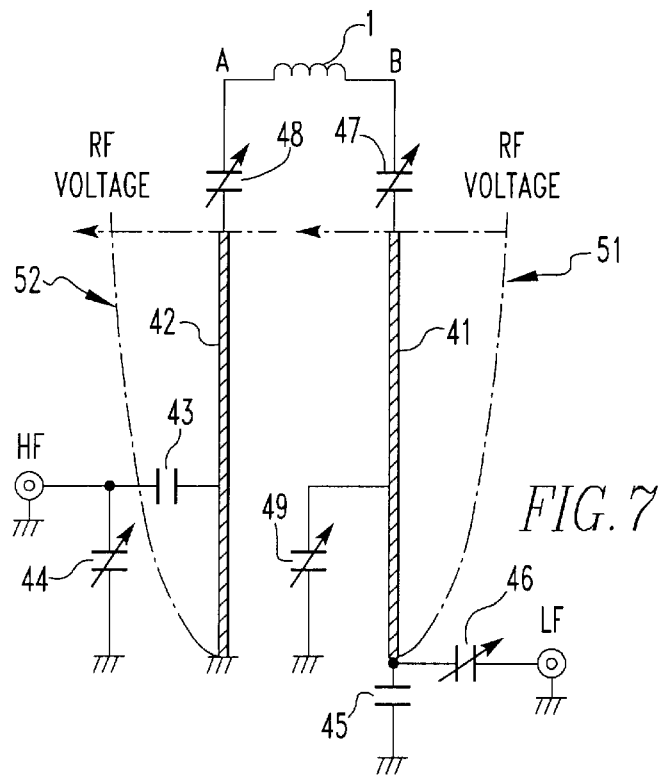
FIG. 7 is a circuit diagram of yet another multiple-tuned circuit according to the present invention, the circuit being for use in an NMR spectrometer.

The distributions of the amplitudes of RF voltages at the conductors 41 and 42 at HF resonance are shown in FIG. 7. The lower end of the conductor 41 is indirectly grounded via the capacitor 45. Since the lower end of the conductor 42 is directly grounded, standing waves produced on the parallel line formed by the conductors 41 and 42 assume a minimum amplitude of 0 at the lower end and a maximum amplitude at the upper end. The amplitudes of the waves on the conductors 41 and 42 are opposite in sign as indicated by voltage amplitudes 51 and 52, respectively.

Since the variable capacitors 47 and 48 for LF tuning have a sufficiently large capacitance, the impedance is sufficiently low compared with the resonance frequency of the HF nucleus at this time and can be neglected compared with the impedance of the sample coil 1. Therefore, the present situation is equivalent to directly short-circuiting the sample coil 1, conductors 41, 42. Consequently, the voltage applied across the variable capacitors 47 and 48 for LF tuning is quite small. There is no danger that these variable capacitors 47 and 48 are damaged by RF voltages.

At the resonance frequency of the HF nucleus, the conductor 41, sample coil 1, conductor 42, and capacitor 45 together form a resonator circuit. Tuning between an external HF supply source and the resonator circuit made up of the conductor 41, sample coil 1, conductor 42, and capacitor 45 is performed with the variable capacitor 49. The matching is performed with the variable capacitor 44.

Figure 1:
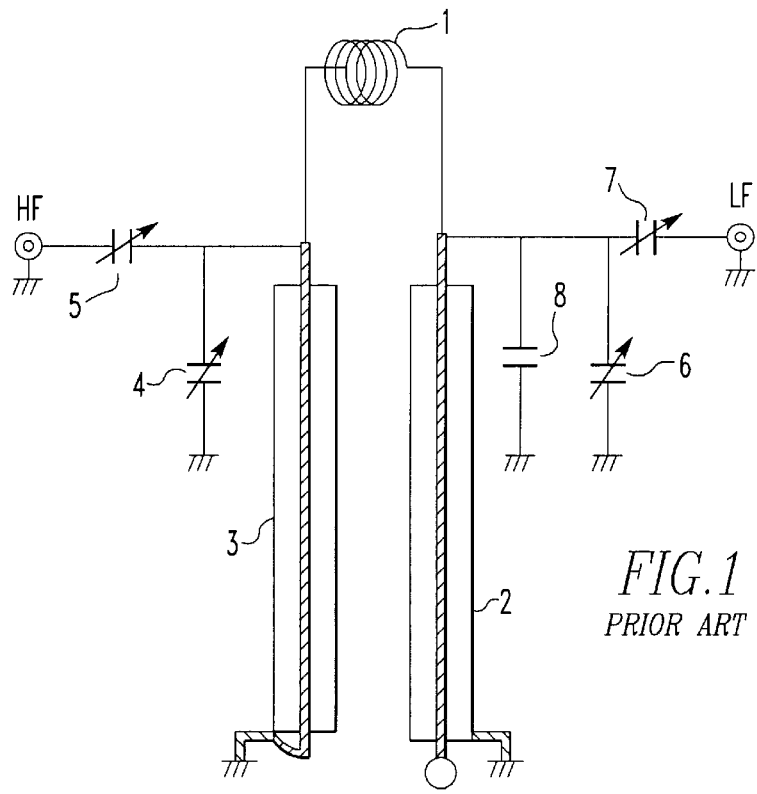
FIGS. 1 and 2 are diagrams of a conventional multiple-tuned circuit for use in an NMR spectrometer.
Figure 2:
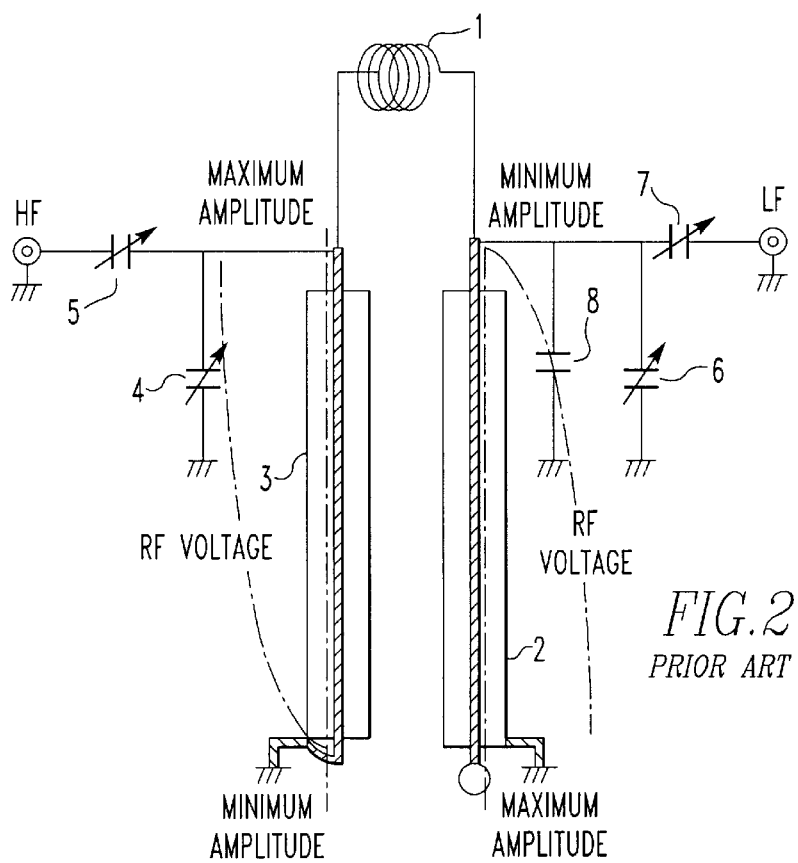
Figure 3:
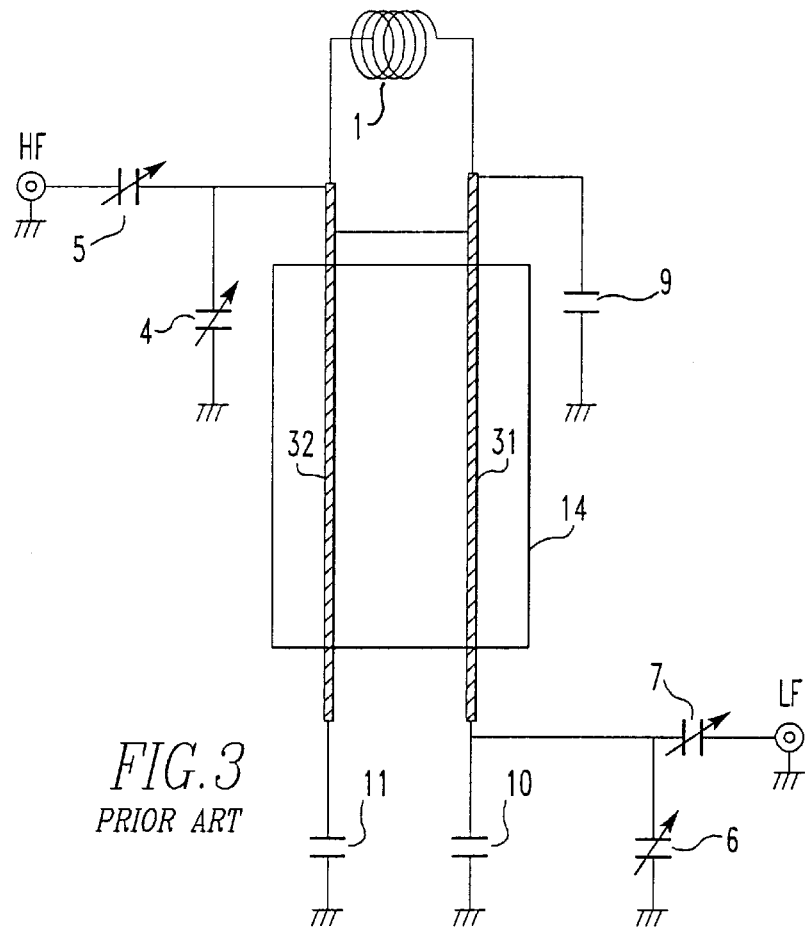
FIG. 3 is a diagram of another conventional multiple-tuned circuit for use in an NMR spectrometer.

HF resonance induced in the sample coil 1 is a balanced resonance in which RF voltages are opposite in sign but have the same amplitude. Therefore, for the same RF electric power, the RF voltage applied across the sample coil 1 is half of the voltage applied in the case of the conventional unbalanced circuit shown in FIGS. 1 and 2. Furthermore, the connection positions of the tuning and matching circuits for HF are not at the upper ends of the conductors 41 and 42 at which the amplitude of the RF voltage is maximal (i.e., the opposite ends of the sample coil 1), but are in arbitrary intermediate positions in the conductors 41 and 42 at which the amplitude of the RF voltage is comparatively small. The RF voltage applied to the capacitor 43, variable capacitor 44, and variable capacitor 49 in practice can be suppressed further compared with the conventional unbalanced circuit shown in FIGS. 1 and 2 in which the RF voltage is halved.

Meanwhile, at the resonance frequency of an LF nucleus, the conductor 41 is indirectly grounded via the capacitor 45. The sample coil 1 and the variable capacitors 47, 48 used for LF tuning and connected across the sample coil 1 form an LC resonator circuit. Since the capacitance of the capacitor 45 is set sufficiently large compared with the capacitances of the variable capacitors 47 and 48 for LF tuning, the impedance is sufficiently low at the resonance frequency of the LF nucleus and can be neglected compared with the impedances of the sample coil 1 and variable capacitors 47, 48. Therefore, the circuit section between the variable capacitors 47 and 48 is equivalent to directly short-circuiting them at ground potential. Accordingly, if the capacitance of the capacitor 45 is increased, the LF resonance frequency will not decrease. Furthermore, at the resonance frequency of the LF nucleus, the wavelength hardly affects the lengths of the conductors 41 and 42 and so the impedances of the conductors 41 and 42 are negligibly small.

If the variable capacitors 47 and 48 are set to the same capacitance, the RF voltages at the opposite ends of the sample coil 1 are opposite in sign but have the same amplitude. Therefore, for the same RF electric power, RF voltages applied to the variable capacitors 47 and 48 are only halves of the RF voltages in the conventional unbalanced circuit shown in FIGS. 1 and 2.

In the present circuit, the conductor 41, variable capacitor 47, sample coil 1, variable capacitor 48, and conductor 42 are connected in series. The capacitor 45 is connected in parallel with this series combination. Since the impedances of the conductors 41, 42 and capacitor 45 can be neglected, the circuit can be regarded as an LC resonator circuit consisting of variable capacitors 47, 48 and sample coil 1. The circuit can be tuned to a higher LF frequency without suffering from decrease in the resonance frequency due to the impedances of the conductors 41, 42 and capacitor 45, by making the capacitances 47 and 48 variable.

Figure 8:
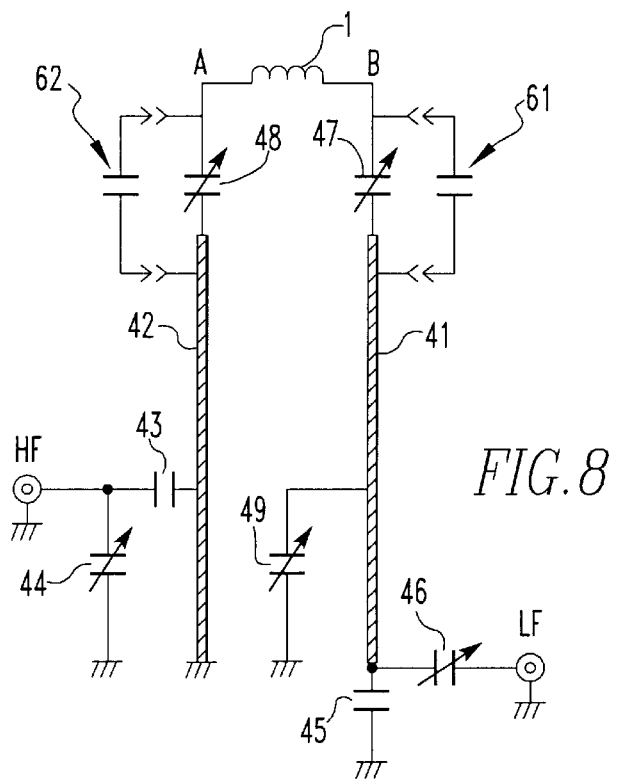
FIG. 8 is a circuit diagram of still another multiple-tuned circuit according to the present invention, the circuit being for use in an NMR spectrometer.

It is conceivable that various modifications and changes are made within the scope of the invention. FIG. 8 shows another multiple-tuned circuit of the present invention, the circuit being for use in an NMR spectrometer. This circuit has capacitors 61 and 62 replaceably connected in parallel with variable capacitors 47 and 48, respectively, for LF tuning. This can extend the tunable range of LF frequencies of the multiple-tuned circuit. Instead of the capacitors, coils may be mounted.

FIG. 9 shows a further multiple-tuned circuit of the present invention, the circuit being for use in an NMR spectrometer. As shown, variable capacitors 47 and 48 for LF tuning can be inserted in any arbitrary position in the conductors 41 and 42, because the impedances of the conductors 41 and 42 are sufficiently small at LF.

Referring next to FIG. 10, there is shown a further multiple-tuned circuit according to the present invention, the circuit being for use in an NMR spectrometer. In the present embodiment, one end of a third conductor 83 is connected with the lower end of a conductor 41, while the other end of the third conductor 83 is grounded via a capacitor 81 to permit triple tuning at HF, first LF, and second LF. A variable capacitor 82 for second LF tuning is connected to the junction of the conductor 83 and the capacitor 81. The third conductor 83 may be connected with the lower end of the conductor 42 instead of the lower end of the conductor 41. Alternatively, the third conductor may be connected with the lower ends of both conductors 41 and 42. All of these circuits are equivalent.

The capacitance of the capacitor 45 is set to a sufficiently large value in the same way as in other embodiments in which double tuning is performed. The capacitance of the capacitor 81 is set to a value larger than the capacitance of the capacitor 45. At HF resonance, the conductor 83 is grounded via the capacitor 45 and thus does not adversely affect the HF resonator circuit. The operation itself of the HF resonator circuit is exactly the same as the operation of other embodiments.

Meanwhile, in the first LF resonator circuit, the conductor 42, variable capacitor 48, sample coil 1, variable capacitor 47, and conductor 41 are connected in series. The capacitor 45 is connected in parallel with this series combination. The impedances of the conductors 41 and 42 can be neglected. The impedance of the capacitor 45 is small and can be regarded as being short-circuited. Therefore, the circuit can be regarded as an LC resonator circuit consisting of variable capacitors 47, 48 and sample coil 1. The circuit can be tuned to higher LF frequencies without suffering from decrease in the resonance frequency due to the impedances of the conductors 41, 42, and capacitor 45 by making the capacitances 47 and 48 variable.

In the second LF resonator circuit, the conductor 42, variable capacitor 48, sample coil 1, variable capacitor 47, conductor 41, and conductor 83 are connected in series. Capacitors 45 and 81 are connected in parallel with this series combination. The impedances of the conductors 41 and 42 can be neglected. Also, the contribution of the capacitor 45 is small. In practice, the circuit can be regarded as an LC resonator circuit consisting of a series circuit with which the capacitor 81 is connected in parallel, the series circuit consisting of variable capacitor 48, sample coil 1, variable capacitor 47, and conductor 83. The circuit can be tuned to a resonance frequency lower than the resonance frequency of the first LF resonator circuit.

It is to be understood that the tuning and matching method making use of electrostatic coupling in the various embodiments described above constitutes only one example and that the invention is not limited thereto. For instance, a method utilizing inductive coupling may also be used.

Multiple-tuned circuits embodying the present invention and used in NMR spectrometers have been described thus far. Specific examples in which these multiple-tuned circuits are actually mounted in a probe for an NMR spectrometer are described below.

Figure 11A:
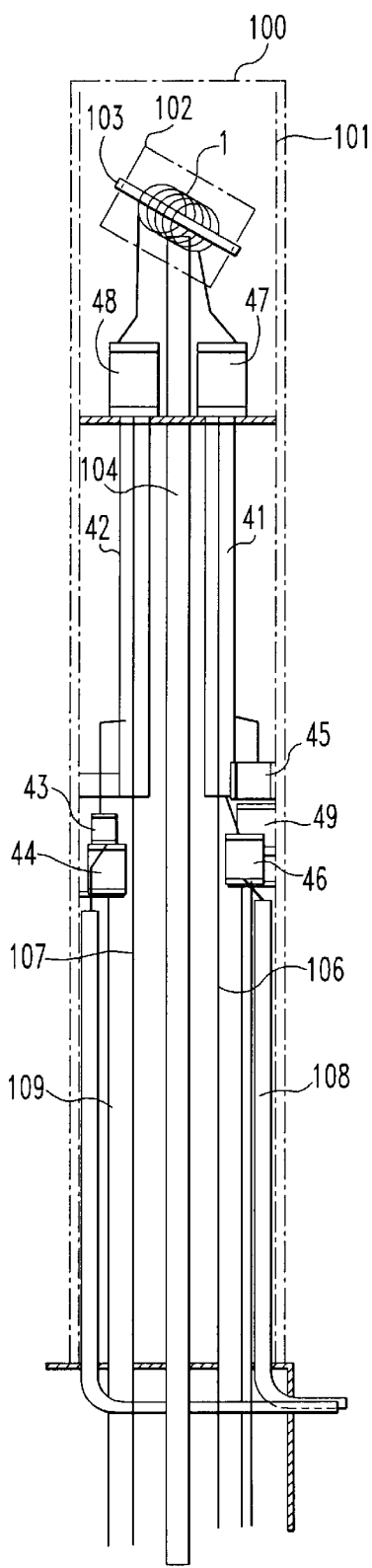
FIGS. 11(a), 11(b), and 11(c) are diagrams of an NMR probe according to the present invention.
Figure 11B:
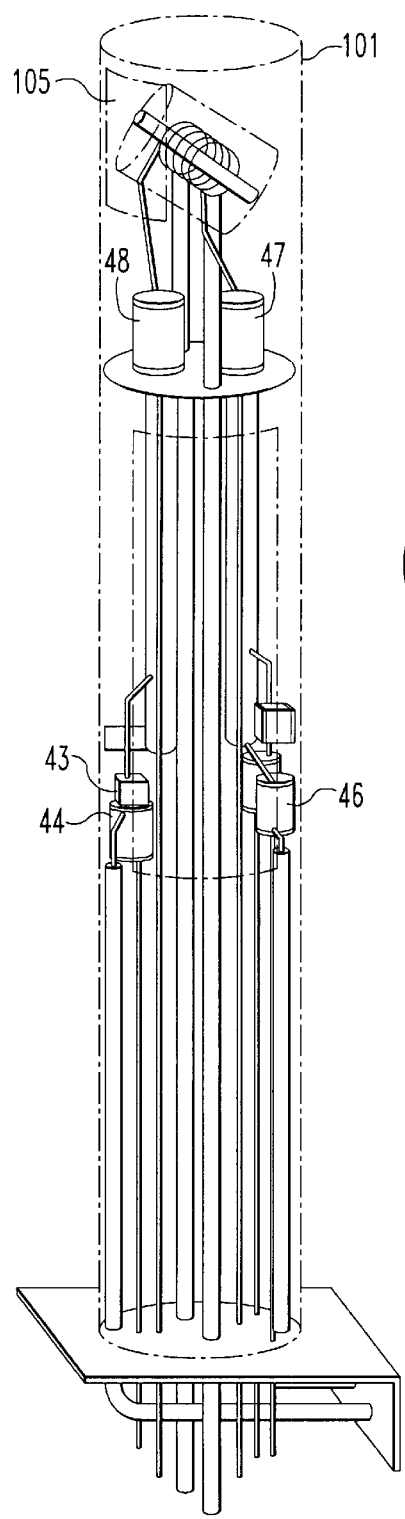
Figure 11C:
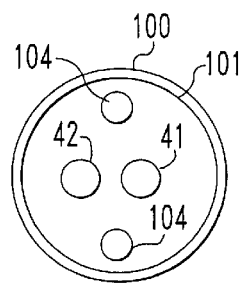

FIGS. 11(a)–11(c) show the arrangement and structures of electronic components where a multiple-tuned circuit according to the present invention is mounted in a probe, the circuit being for use in an NMR spectrometer. FIG. 11(a) is a vertical cross-sectional view of the probe. FIG. 11(b) is a view similar to FIG. 11(a), but in which the cover of the probe has been removed. FIG. 11(c) is a horizontal cross-sectional view of the probe. This embodiment assumes an NMR probe dedicated for solid samples. The probe rotates a sample tube at a high speed, the tube being tilted at a given angle to an external magnetic field.

The NMR probe has a cover 100. A tubular electrode 101 that is hollow cylinder in shape is mounted inside the cover 100. A sample-rotating mechanism 102 is mounted at a given angle to an external magnetic field inside the upper part of the tubular electrode 101. A sample coil 1 is mounted inside the sample-rotating mechanism 102. A sample tube 103 in which a solid sample is sealed is placed inside the sample coil 1. An air tube 104 is connected with the sample-rotating mechanism 102 to rotate the sample tube 103 at a high speed. A pressurized air jet is appropriately blown against the sample tube 103 to drive it. An opening 105 is formed in an upper part of the tubular electrode 101 to place the inside of the probe in communication with the outside, thus permitting the sample tube 103 to be inserted into and withdrawn from the sample-rotating mechanism 102.

Variable capacitors 47 and 48 for LF tuning are connected with the opposite ends of the sample coil 1. Their capacitances are varied with shafts 106 and 107, respectively. Conductors 41 and 42 are used as internal conductors, and a tubular electrode 101 is used as an outer conductor, in addition to the variable capacitors 47 and 48 for LF tuning. In this way, a quarter wavelength resonator resonating at HF is constructed as a whole. Also, the variable capacitor 44 for HF matching, variable capacitor 46 for LF matching, variable capacitor 49 for HF tuning, capacitor 43 for HF matching, capacitor 45, and coaxial cables 108, 109 can be compactly mounted by using the tubular electrode 101 as a common grounding electrode.

In this embodiment, the hollow tubular electrode 101 is used as a grounding electrode. This dispenses with the conventional grounding electrode that is a frame consisting of pillars and disks. Hence, a large internal space permitting mounting of electronic components is secured. As a result, heavy-duty variable capacitors having a large outside diameter and withstanding high voltages can be mounted in the variable capacitors 47 and 48 for LF tuning. At RF resonance, the multiple-tuned circuit can withstand higher voltages than conventional. The tubular electrode 101 is used as a grounding electrode, and the ground impedance is made lower than conventional. As a result, power loss at higher frequencies can be reduced. Furthermore, HF resonance frequencies that are higher than conventional can be obtained. Additionally, the use of the large-sized tubular electrode 101 as the outer conductor of a resonator enhances the Q factor of the resonator itself.

With respect to the large-sized capacitive elements 47 and 48, it is necessary to adjust the lengths of the conductors 41 and 42 to be shorter than the length of a quarter wavelength, because their interelectrode distance is large. Therefore, the length of the conductors 41 and 42 does not need to be equal to a quarter wavelength. It is only necessary that the whole circuit including the capacitive elements 47, 48, and 45 operate as a quarter wavelength resonator. The capacitive elements 47 and 48 connect the respective one end of the conductors 41 and 42 with the sample coil 1. The capacitive element 45 grounds the other ends of the conductors 41 and 42.

Furthermore, the shape of the tubular electrodes 101 is not limited to a cylindrical form. In addition, the tubular electrode 101 does not need to cover the whole probe. The tubular electrode may cover only the electric circuit portion of a multiple-tuned circuit.

While an NMR probe incorporating the multiple-tuned circuit shown in FIG. 4 has been described thus far as a typical example, it is obvious that the mounting method using the tubular electrode 101 as an external electrode and as a grounding electrode can be similarly applied to other embodiments shown in FIGS. 5–10.

As described thus far, the inventive multiple-tuned circuit and probe for use in an NMR spectrometer use a balanced resonator circuit instead of a conventional unbalanced circuit. A tuning circuit and a matching circuit for HF are connected in intermediate positions in the balanced resonator circuit. Therefore, where the same electric power is injected, the RF voltage applied to electric circuit components is halved or reduced more. This improves the power capacity of the circuit. In addition, tuning capacitive elements for LF are inserted between the balanced resonator circuit and the sample coil or in intermediate positions in the balanced resonator circuit. Consequently, higher resonance frequencies can be obtained in both HF and LF.

Having thus described my invention with the detail and particularity required by the Patent Laws, what is desired protected by Letters Patent is set forth in the following claims.

The invention claimed is:

1. A multiple-tuned circuit for use in a nuclear magnetic resonance spectrometer, comprising:
  a sample coil having ends A and B;
  a first conductor having one end connected with the end A of the sample coil and another end connected to ground via a capacitive element or directly;
  a second conductor having one end connected with the end B of the sample coil and another end connected to ground via a capacitive element or directly;
  a tuning capacitive element for a second frequency, said tuning capacitive element being inserted in at least one of (i) a first junction at the end A of the sample coil and said first conductor, (ii) a second junction at the end B of the sample coil and said second conductor, and (iii) an intermediate position in said first or second conductor;
  a matching circuit and a tuning circuit for a first frequency; and
  a matching circuit for said second frequency,
  wherein said first and second conductors and said capacitive elements together form a quarter wavelength resonator for said first frequency, some of said capacitive elements being connected to the ends of said conductors, the other capacitive elements being connected intermediate said conductors.

2. A multiple-tuned circuit for use in a nuclear magnetic resonance spectrometer as set forth in claim 1, wherein said matching circuit for said first frequency is located in one of a given position in said first conductor and a given position in said second conductor.

3. A multiple-tuned circuit for use in a nuclear magnetic resonance spectrometer as set forth in claim 1, wherein said tuning circuit for said first frequency is located in at least one of a given position in said first conductor and a given position in said second conductor.

4. A multiple-tuned circuit for use in a nuclear magnetic resonance spectrometer as set forth in claim 3, wherein said matching circuit for said second frequency is located in one of a given position in said first conductor and a given position in said second conductor.

5. A multiple-tuned circuit for use in a nuclear magnetic resonance spectrometer as set forth in claim 4, wherein electric circuit elements such as capacitive elements and inductive elements are replaceably added in parallel with said tuning capacitive element for said second frequency.

6. A multiple-tuned circuit for use in a nuclear magnetic resonance spectrometer as set forth in claim 5, wherein said first frequency is higher than said second frequency.

7. A multiple-tuned circuit for use in a nuclear magnetic resonance spectrometer as set forth in claim 6, wherein there is further provided a third conductor whose one end is connected with at least one of the ends of said first and second conductors, said third conductor having another end connected with a matching circuit for a third frequency and grounded via a capacitive element.

8. A multiple-tuned circuit for use in a nuclear magnetic resonance spectrometer as set forth in claim 7, wherein said first frequency is higher than said second and third frequencies.

9. A probe for use in an NMR spectrometer, said probe including a multiple-tuned circuit comprising:
    a sample coil having ends A and B;
    a first conductor having one end connected with the end A of the sample coil and another end connected to ground via a capacitive element or directly;
    a second conductor having one end connected with the end B of the sample coil and another end connected to ground via a capacitive element or directly;
    a tuning capacitive element for a second frequency, said tuning capacitive element being inserted in at least one of (i) a first junction of the end A of the sample coil and said first conductor, (ii) a second junction of the end B of the sample coil and said second conductor, and (iii) an intermediate position in said first or second conductor;
    a matching circuit and a tuning circuit for a first frequency;
    a matching circuit for said second frequency; and
    a tubular electrode surrounding at least outer surfaces of electrical circuit portions of the multiple-tuned circuit, said tubular electrode being used as a grounding electrode for said multiple-tuned circuits,
    wherein said first and second conductors and said capacitive elements together form a quarter wavelength resonator for said first frequency, some of said capacitive elements being connected to the ends of said conductors, others of said capacitive elements being connected intermediate said conductors.

10. A probe for use in an NMR spectrometer as set forth in claim 9, wherein said matching circuit for said first frequency is located in any one of a given position in said first conductor and a given position in said second conductor.

11. A probe for use in an NMR spectrometer as set forth in claim 10, wherein said tuning circuit for said first frequency is located in at least one of a given position in said first conductor and a given position in said second conductor.

12. A probe for use in an NMR spectrometer as set forth in claim 11, wherein said matching circuit for said second frequency is located in any one of a given position in said first conductor and a given position in said second conductor.

13. A probe for use in an NMR spectrometer as set forth in claim 12, wherein electric circuit components such as capacitive elements and inductive elements are replaceably added in parallel with said tuning capacitive element for said second frequency.

14. A probe for use in an NMR spectrometer as set forth in claim 13, wherein said first frequency is higher than said second frequency.

15. A probe for use in an NMR spectrometer as set forth in claim 14, wherein there is further provided a third conductor whose one end is connected with at least one of the ends of said first and second conductors, said third conductor having another end connected with a matching circuit for a third frequency and grounded via a capacitive element.

16. A probe for use in an NMR spectrometer as set forth in claim 15, wherein said first frequency is higher than said second and third frequencies.

17. A probe for use in an NMR spectrometer as set forth in claim 16, wherein said tubular electrode is provided with an opening in a given position to place the inside of the probe in communication with the outside.

* * * * *

UNITED STATES PATENT AND TRADEMARK OFFICE
CERTIFICATE OF CORRECTION

PATENT NO. : 6,686,741 B2  
DATED : February 3, 2004  
INVENTOR(S) : Kenichi Hasegawa Page 1 of 1

It is certified that error appears in the above-identified patent and that said Letters Patent is hereby corrected as shown below:

<u>Title page,</u>  
Insert: -- [30] Foreign Application Priority Data  
      April 10, 2001   (JP) ..........2001-111356  
      October 16, 2001 (JP) ..........2001-317716 --.

Signed and Sealed this

Eighth Day of June, 2004

JON W. DUDAS  
*Acting Director of the United States Patent and Trademark Office*